United States Patent
Lee et al.

(10) Patent No.: US 6,771,506 B2
(45) Date of Patent: Aug. 3, 2004

(54) HEAT SINK FASTENER

(75) Inventors: Hsieh Kun Lee, Tu-chen (TW); Meng Tzu Lee, Tu-Chen (TW); Herney Zhu, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/342,535

(22) Filed: Jan. 14, 2003

(65) Prior Publication Data

US 2004/0037038 A1 Feb. 26, 2004

(30) Foreign Application Priority Data

Aug. 23, 2002 (TW) .................................. 91213120 U

(51) Int. Cl.[7] .............................................. H05K 7/20
(52) U.S. Cl. .................. 361/704; 361/707; 361/709; 257/718; 257/719; 257/727; 174/16.3; 165/80.3
(58) Field of Search ........................ 361/703, 704, 361/719; 257/718, 719, 727; 174/16.3; 165/80.3; 24/453, 458; 248/505, 510

(56) References Cited

U.S. PATENT DOCUMENTS

| | | | | |
|---|---|---|---|---|
| 5,448,449 A | * | 9/1995 | Bright et al. ............... | 361/704 |
| 5,638,258 A | * | 6/1997 | Lin ............................. | 361/704 |
| 6,318,452 B1 | * | 11/2001 | Lee ............................ | 165/80.3 |
| 6,414,848 B1 | * | 7/2002 | Chen .......................... | 361/704 |
| 6,456,493 B1 | * | 9/2002 | Lee ............................ | 361/704 |
| 6,522,545 B2 | * | 2/2003 | Shia et al. .................. | 361/704 |

* cited by examiner

Primary Examiner—Boris Chervinsky
(74) Attorney, Agent, or Firm—Wei Te Chung

(57) ABSTRACT

A heat sink fastener (10) includes a pressing beam (20), a clamping beam (30), and an operating lever (40). The pressing beam includes a first pivot portion (26) at one end thereof, and a hook (242) at an opposite end thereof. The clamping beam has a second pivot portion (32) at a top end thereof, and a hook (34) at a bottom end thereof. The operating lever is pivotally engaged with each of the first and second pivot portions. The operating lever includes a pair of parallel pivot plates (44), each forming a protrusion (446) on an internal face thereof. In use of the fastener, the fastener is unlocked when the protrusions and the clamping beam are disposed at a same side of the first pivot portion. The fastener is locked when the protrusions and the clamping beam are disposed at opposite sides of the first pivot portion.

20 Claims, 6 Drawing Sheets

HEAT SINK FASTENER

BACKGROUND OF THE INVENTION

1. Field of the Invention

The present invention relates to heat sink fasteners, and more particularly to a heat sink fastener which easily and firmly fastens a heat sink to an electronic package.

2. Description of Prior Art

With the rapid development of electronics technology, electronic packages such as CPUs are able to process signals at unprecedented high speeds. As a result, CPUs can generate copious amounts of heat. The heat must be efficiently removed from the CPU. Otherwise, abnormal operation or damage may result.

Conventionally, a fastener secures a heat sink on a CPU to remove heat therefrom. A common fastener is integrally formed and substantially M-shaped to provide the fastener with resiliency. However, the fastener has some shortcomings. If the fastener is too weak, the heat sink cannot be firmly and reliably secured to the CPU. If the fastener is too strong, one or more additional tools are required for securing and detachment of the heat sink. Any additional tools render these procedures unduly laborious.

To overcome the shortcomings of the above-mentioned integrally formed fasteners, multiple piece fasteners have been developed. U.S. Pat. No. 5,638,258 discloses a multiple piece fastener. Referring to FIG. 7, the fastener comprises a pressure bar 1, an actuating lever 2, and a clamping bar 3. One end of the pressure bar 1 is fastened to one side of a CPU mounting module. The actuating lever 2 is pivotably attached to an opposite end of the pressure bar 1. The clamping bar 3 is pivotably attached to the actuating lever 2, and one end of the clamping bar 3 is fastened to an opposite side of the CPU mounting module. When the actuating lever 2 is rotated up toward the pressure bar 1, the fastener is secured to the CPU mounting module. The pressure bar 1 resiliently presses the heat sink on the CPU. When the actuating lever 2 is rotated up away from the pressure bar 1, the fastener is released from engagement with the CPU mounting module.

The above-described multiple piece fastener overcomes certain of the shortcomings of integrally formed fasteners. However, the actuating lever 2 is not fixed, and is prone to be displaced when the fastener is subjected to vibration or shock during normal use. Displacement of the actuating lever 2 can cause the pressure bar 1 and the clamping bar 3 to be released from resilient engagement with the CPU mounting module.

SUMMARY OF THE INVENTION

Accordingly, an object of the present invention is to provide a heat sink fastener which easily and firmly fastens a heat sink to an electronic package.

In order to achieve the object set out above, a heat sink fastener in accordance with a preferred embodiment of the present invention comprises a pressing beam, a clamping beam and an operating lever. The pressing beam includes a first pivot portion at one end thereof, and a hook at an opposite end thereof. The clamping beam has a second pivot portion at a top end thereof, and a hook at a bottom end thereof. The operating lever is pivotally engaged with each of the first and second pivot portions. The operating lever includes a pair of parallel pivot plates, each forming a protrusion on an internal face thereof. In use of the fastener, the fastener is unlocked when the protrusions and the clamping beam are disposed at a same side of the first pivot portion. The operating lever is pressed to move the fastener from the unlocked position to a locked position. The fastener is thus locked when the protrusions and the clamping beam are disposed at opposite sides of the first pivot portion. In this position, the protrusions are blocked by the first pivot portion from moving back toward their original positions. That is, the protrusions lock the operating lever in position. Thus, a heat sink can be easily and securely attached on an electronic package by, say, a pair of the fasteners in the exemplary application disclosed.

Other objects, advantages and novel features of the present invention will become more apparent from the following detailed description when taken in conjunction with the accompanying drawings, in which:

DETAILED DESCRIPTION OF THE INVENTION

Figure 1:
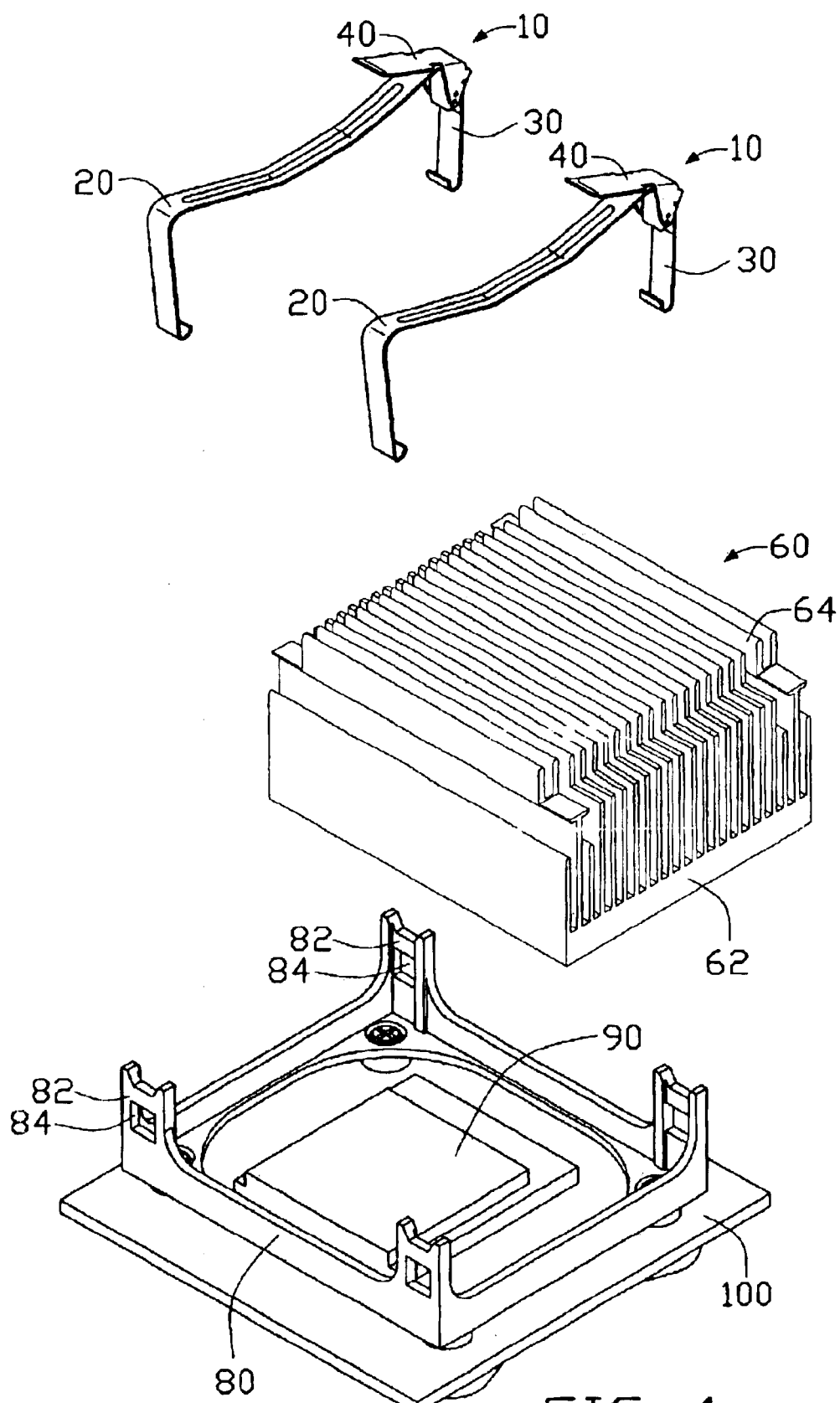
FIG. 1 is an exploded isometric view of a pair of heat sink fasteners each in accordance with a preferred embodiment of the present invention, together with a heat sink, an electronic package mounted on a printed circuit board (PCB), and a frame secured on the PCB around the electronic package.

Referring to FIG. 1, a heat sink fastener 10 in accordance with a preferred embodiment of the present invention comprises a pressing beam 20, a clamping beam 30 and an operating lever 40. A pair of the fasteners 10 can be engaged with a frame 80, for attaching a heat sink 60 on an electronic package 90 that is mounted on a printed circuit board (PCB) 100.

The frame 80 comprises two pairs of ears 82. Each pair of ears 82 extends upwardly from respective opposite ends of one of respective opposite sides of the frame 80. Each ear 82 defines an opening 84 therein. The heat sink 60 comprises a base 62, and a plurality of fins 64 extending perpendicularly from the base 62.

Figure 2:
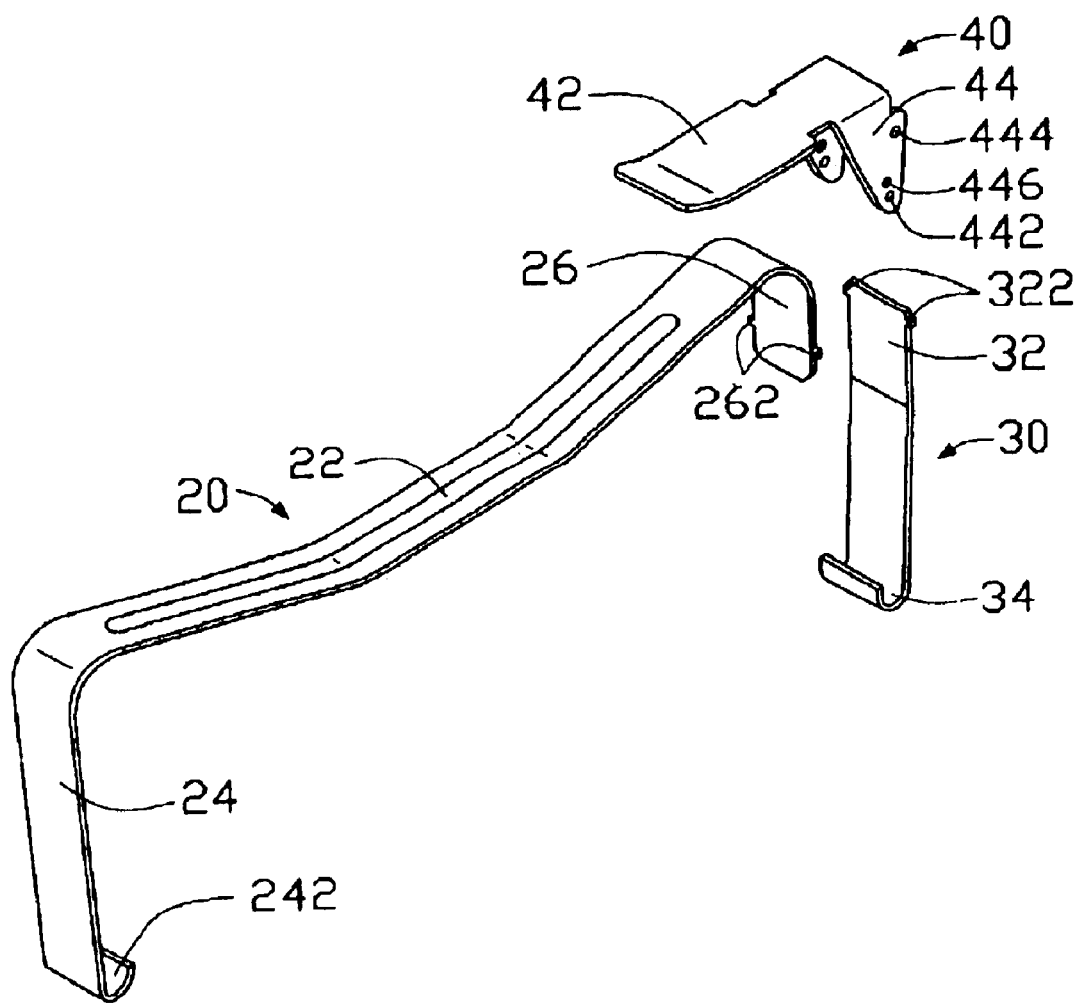
FIG. 2 is an enlarged, exploded isometric view of one of the heat sink fasteners of FIG. 1.

Referring also to FIG. 2, the pressing beam 20 of each fastener 10 integrally comprises a central pressing portion 22, a clamping portion 24 depending from one end of the pressing portion 22, and a first pivot portion 26 depending from an opposite end of the pressing portion 22. The pressing portion 22 is adapted to resiliently press on the heat sink 60. The clamping portion 24 forms a hook 242 at a distal end thereof, for engaging with a corresponding opening 84 of the frame 80. A pair of first pivot pins 262 is outwardly formed from respective opposite edges of the first pivot portion 26.

The clamping beam 30 comprises a second pivot portion 32 at a top end thereof. A pair of second pivot pins 322 is outwardly formed at respective opposite edges of the second pivot portion 32. The clamping beam 30 forms a hook 34 at a bottom end thereof, for engaging with a corresponding opening 84 of the frame 80.

The operating lever 40 is pivotable relative to the pressing beam 20 and the clamping beam 30. The operating lever 40 comprises a handle 42, and a pair of parallel pivot plates 44 extending perpendicularly in a same direction from respective opposite longitudinal edges of the handle 42 at one end of the handle 42. An opposite end of the handle 42 is slightly bent, for facilitating manual operation thereof. The pivot plates 44 are generally triangular, and symmetrically oppose each other. Each pivot plate 44 defines a first pivot hole 442 distal from the handle 42, and a second pivot hole 444 near the handle 42. The first and second pivot holes 442, 444 are for pivotably receiving the first and second pivot pins 262, 322 respectively. Each pivot plate 44 forms a protrusion 446 on an internal face thereof. The protrusion 446 is offset from an imaginary line joining the first and second pivot holes 442, 444.

In assembly, the second pivot pins 322 of the clamping beam 30 are received in the second pivot holes 444 of the operating lever 40. The clamping beam 30 is thus pivotably attached to the operating lever 40. The first pivot pins 262 of the pressing beam 20 are received in the first pivot holes 442 of the operating lever 40. The pressing beam 20 is thus pivotably attached to the operating lever 40. The first pivot portion 26 of the pressing beam 20 and the second pivot portion 32 of the clamping beam 30 are disposed between the pivot plates 44 of the operating lever 40. The clamping beam 30 and the clamping portion 24 of the pressing beam 20 are disposed at opposite sides of the pressing portion 22.

Figure 3:
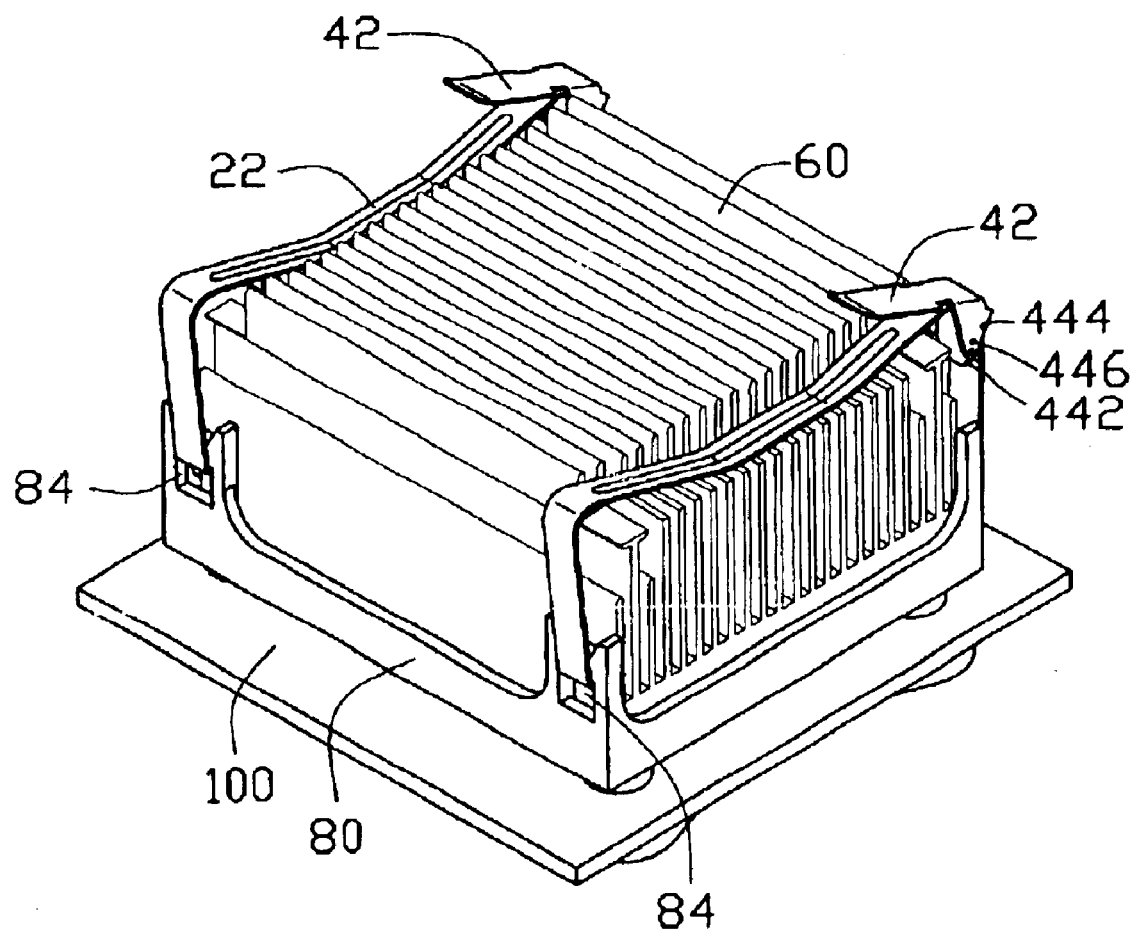
FIG. 3 is an assembled view of FIG. 1, showing operation levers of the fasteners in respective unlocked positions.
Figure 4:
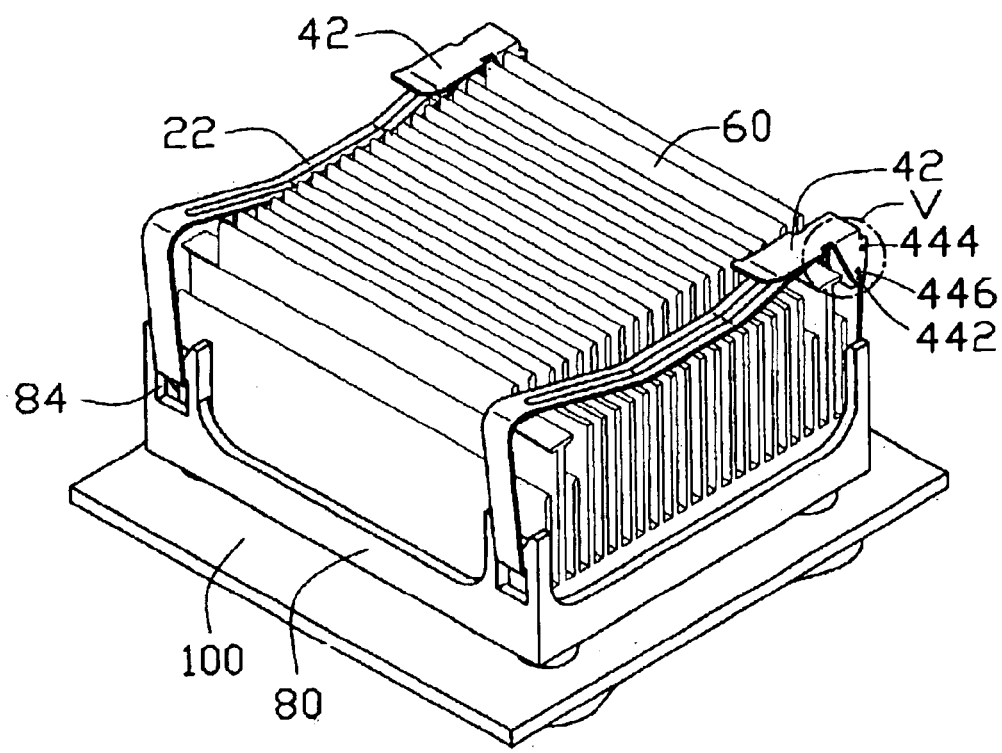
FIG. 4 is similar to FIG. 3, but showing the operation levers of the fasteners in respective locked positions.
Figure 5:
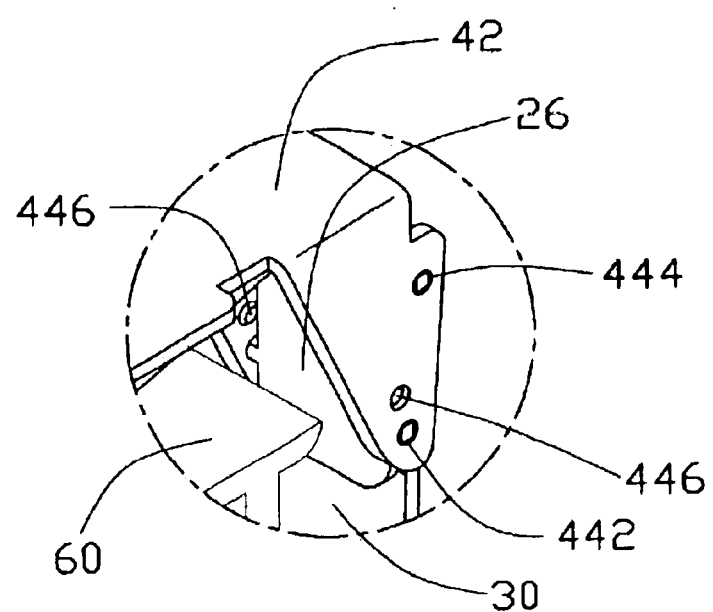
FIG. 5 is an enlarged view of a circled portion V of FIG. 4.

Referring to FIGS. 3–4, in use of a pair of the fasteners 10, the heat sink 60 is placed on the electronic package 90. The fasteners 10 are placed on opposite sides of the heat sink 60, with the pressing portions 22 of the fasteners 10 resting on respective recessed top portions of the fins 64 of the heat sink 60. The hooks 242, 34 of the pressing beams 20 and clamping beams 30 are loosely received in the openings 84 of the frame 80. In this unlocked position, the protrusions 446 and the clamping beam 30 of each fastener 10 are disposed at a same side of the first pivot portion 26. The handle 42 of the operating lever 40 is then pressed downwardly, to cause the operating lever 40 to rotate about an axis defined by the first pivot holes 442. Thus, the clamping beam 30 is actuated to rotate about an axis defined by the second pivot holes 444. The clamping beam 30 moves upwardly and toward the first pivot portion 26 of the pressing beam 20. The protrusions 446 of the operating lever 40 ride over the opposite edges of the first pivot portion 26, such that the protrusions 446 and the clamping beam 30 are disposed at respective opposite sides of the first pivot portion 26 (see FIG. 5). Simultaneously, the hook 34 of the clamping beam 30 moves upwardly so that the pressing portion 22 of the pressing beam 20 resiliently presses the fins 64 of the heat sink 60, and the hooks 242, 34 of the pressing beam 20 and clamping beam 30 are firmly engaged with the ears 82 of the frame 80. In this position, the protrusions 446 are blocked by the first pivot portion 26 from moving back toward their original positions. That is, the protrusions 446 lock the operating lever 40 in position. Thus, the heat sink 60 is easily and securely attached on the electronic package 90 by the fasteners 10.

To detach the heat sink 60, the handle 42 of the operating lever 40 of each fastener 10 is pulled upwardly, to cause the operating lever 40 to rotate about the axis defined by the first pivot holes 442. The protrusions 446 ride back over the opposite edges of the first pivot portion 26, such that the protrusions 446 and the clamping beam 30 are disposed at said same side of the first pivot portion 26. Thus, the operating lever 40 is unlocked, and the clamping beam 30 is rotated about the axis defined by the second pivot holes 444. The hooks 242, 34 are released from engagement with the ears 82, and are loosely disposed in the openings 84. The fasteners 10 are removed from the assembly. The heat sink 60 is then easily removed from the electronic package 90.

Figure 6:
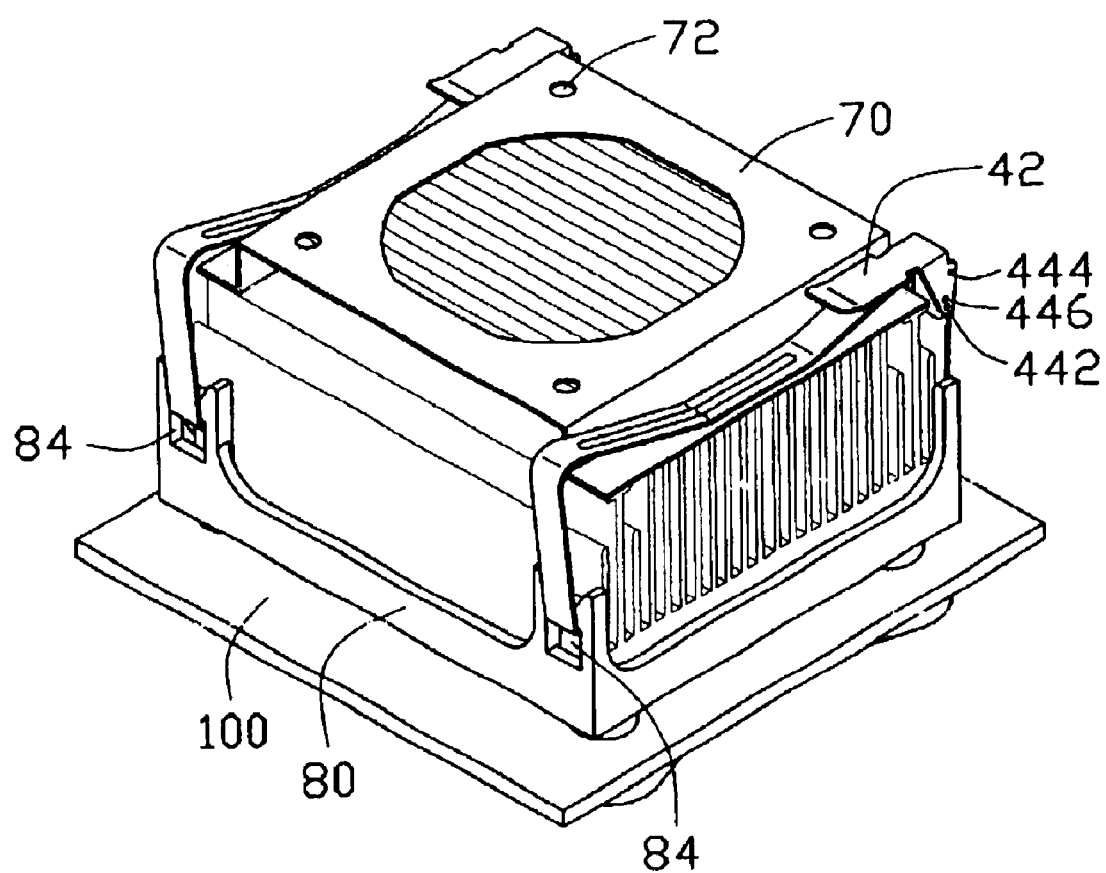
FIG. 6 is similar to FIG. 4, but showing a fan holding seat sandwiched between the fasteners and the heat sink, the fan holding seat thus being secured on the heat sink.
Figure 7:
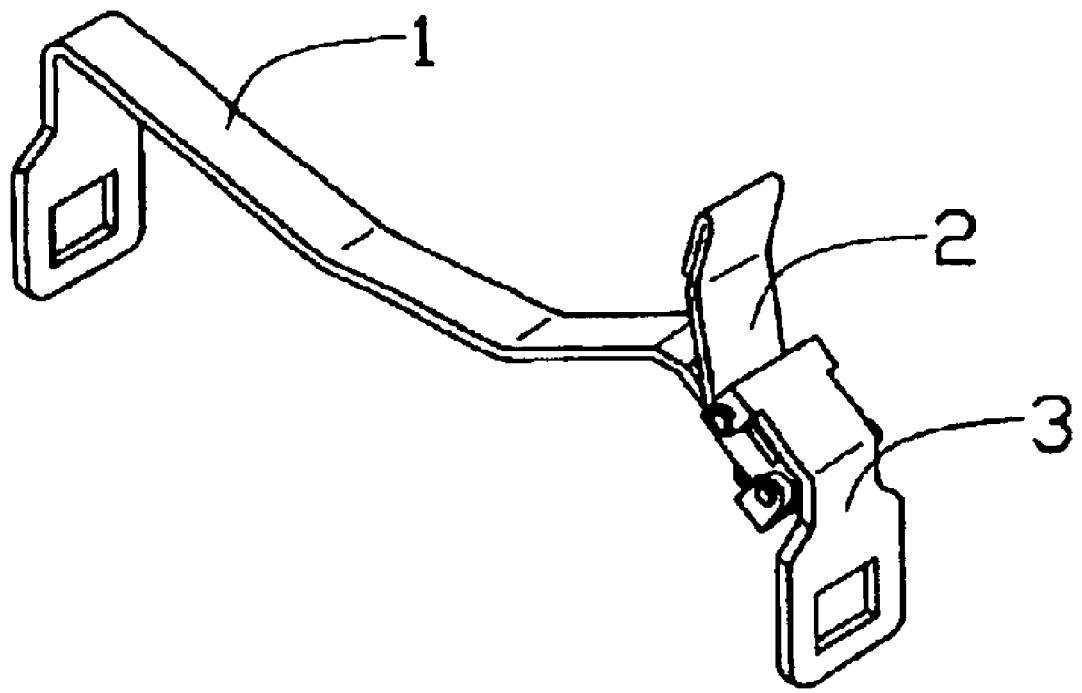
FIG. 7 is an isometric view of a conventional heat sink fastener.

Referring also to FIG. 6, in a further application, a fan holding seat 70 is placed on the heat sink 60 for securing of a fan (not shown) thereon to provide forced convection. The fan holding seat 70 is sandwiched between the fasteners 10 and the heat sink 60, and is thus secured on the heat sink 60. The fan holding seat 70 defines a plurality of through holes 72 therein for securing the fan thereon. When the fan holding seat 70 is used, operations of the fasteners 10 for attachment and detachment of the heat sink 60 are similar to the above-described operations. For the sake of brevity, further details are not provided herein.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink fastener comprising:
   a pressing beam comprising a first pivot portion;
   a clamping beam comprising a second pivot portion; and
   an operating lever pivotally engaged with the first pivot portion and with the second pivot portion, a blocking portion provided on the operating lever,
   wherein the fastener is unlocked when the blocking portion and the clamping beam are disposed at a same side of the pressing beam; and the fastener is locked when the blocking portion and the clamping beam are disposed at opposite sides of the pressing beam.

2. The heat sink fastener of claim 1, wherein the pressing beam comprises a pressing portion for pressing on a heat sink and a clamping portion extending from the pressing portion and being opposite from the clamping beam.

3. The heat sink fastener of claim 1, wherein the operating lever comprises a pair of symmetrically opposite pivot plates, and the blocking portion is formed on one of the pivot plates.

4. The heat sink fastener of claim 3, wherein the operating lever further comprises a handle for facilitating manual operation thereof.

5. The heat sink fastener of claim 4, wherein the pivot plates extend perpendicularly in a same direction from respective opposite edges of the handle at one end of the handle.

6. The heat sink fastener of claim 3, wherein the blocking portion is a protrusion formed on an internal face of said one of the pivot plates.

7. The heat sink fastener of claim 6, wherein the pivot plates each define a first pivot hole and a second pivot hole therein, the first pivot portion forms a pair of pivot pins at respective opposite edges thereof, said pivot pins are movably received in the first pivot holes of the pivot plates, the second pivot portion forms a pair of pivot pins at respective opposite edges thereof, and said pivot pins are movably received in the second pivot holes of the pivot plates.

8. The heat sink fastener of claim 7, wherein the protrusion is offset from an imaginary line joining the first and second pivot holes of said one of the pivot plates.

9. The heat sink fastener of claim 1, wherein the clamping portion forms a hook at a distal end thereof, and the clamping beam forms a hook at an end thereof distal from the second pivot portion.

10. A heat sink assembly comprising:
a frame;
an electronic package;
a heat sink; and
a fastener engagable with the frame and attaching the heat sink to the electronic package, the fastener comprising a pressing beam, a clamping beam and an operating lever, the operating lever pivotally interconnecting the pressing beam and the clamping beam and comprising a pair of pivot plates having a pair of protrusions;
wherein when the protrusions and the clamping beam are disposed at a same side of the pressing beam, the fastener is unlocked; and when the protrusions and the clamping beam are disposed at opposite sides of the pressing beam the fastener is locked and the heat sink is thereby secured on the electronic package.

11. The heat sink assembly of claim 10, wherein the frame surrounds the electronic package.

12. The heat sink assembly of claim 10, wherein the frame defines a pair of openings at opposite sides thereof.

13. The heat sink assembly of claim 12, wherein the pressing beam forms a hook at an end thereof, the clamping beam forms a hook at an end thereof, and wherein the hooks of the pressing beam and the clamping beam are received in the openings of the frame.

14. The heat sink assembly of claim 10, wherein the fastener directly presses on the heat sink.

15. The heat sink assembly of claim 10, further comprising a fan holding seat disposed on the heat sink and defining a plurality of through holes therein.

16. The heat sink assembly of claim 15, wherein the fastener presses on the fan holding seat.

17. The heat sink assembly of claim 10, wherein a handle is integrally formed with the pivot plates of the operating lever, for facilitating manual operation of the operating lever.

18. A heat sink assembly comprising:
a printed circuit board;
a retainer frame mounted on the printed circuit board;
an electronic package assembly mounted on the printed circuit board and surrounded by the retainer frame;
a heat sink seated upon the electronic package assembly; and
a fastener including:
a pressing beam seated upon and pressing against the heat sink and having one end engaged with the retainer frame;
a clamping beam with one end engaged with the retainer frame; and
an operating lever respectively pivotally linked to said pressing beam and said clamping beam at two different pivots, a looking protrusion formed between said two different pivots; wherein
said locking protrusion is allowed to be freely moveable between two opposite inner sides of said clamping beam and said pressing beam when said fastener is in an unlocked manner, while is located on an outer side of one of said clamping beam and said pressing beam, and latchably engaged with the outer side of said one of the clamping beam and the pressing beam when said fastener is in a locked manner.

19. The assembly of claim 18, wherein said retainer frame is discrete from said electronic package assembly.

20. The assembly of claim 18, wherein said two pivots are essentially aligned with each other in a vertical direction when said fastener is in the locked manner.

* * * * *